(12) United States Patent
Buchanan

(10) Patent No.: US 9,601,195 B2
(45) Date of Patent: Mar. 21, 2017

(54) VOLTAGE CONTROL FOR CROSSPOINT MEMORY STRUCTURES

(71) Applicant: Hewlett-Packard Development Company, L.P., Houston, TX (US)

(72) Inventor: Brent Edgar Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/908,667

(22) PCT Filed: Jul. 31, 2013

(86) PCT No.: PCT/US2013/053041
§ 371 (c)(1),
(2) Date: Jan. 29, 2016

(87) PCT Pub. No.: WO2015/016916
PCT Pub. Date: Feb. 5, 2015

(65) Prior Publication Data
US 2016/0189775 A1    Jun. 30, 2016

(51) Int. Cl.
*G11C 13/00* (2006.01)
*H01L 27/24* (2006.01)
*H01L 29/66* (2006.01)
*H01L 29/86* (2006.01)
*H01L 45/00* (2006.01)
(Continued)

(52) U.S. Cl.
CPC ........ *G11C 13/0059* (2013.01); *G11C 13/003* (2013.01); *G11C 13/004* (2013.01);
(Continued)

(58) Field of Classification Search
CPC ............. H01L 45/1233; H01L 45/1608; H01L 29/861; H01L 29/66106; H01L 29/66113;
(Continued)

(56) References Cited

U.S. PATENT DOCUMENTS

| 3,668,655 | A | 6/1972 | Allen | |
|---|---|---|---|---|
| 2004/0114425 | A1* | 6/2004 | Ezaki | G11C 11/16 365/158 |

(Continued)

FOREIGN PATENT DOCUMENTS

| DE | 3823597 | 1/1990 |
|---|---|---|
| WO | WO-2013055332 | 4/2013 |

OTHER PUBLICATIONS

International Searching Authority, The International Search Report and the Written Opinion, dated Apr. 25, 2014, for PCT/US2013/053041, filed Jul. 31, 2013, 11 Pages.

(Continued)

*Primary Examiner* — Karen Kusumakar
(74) *Attorney, Agent, or Firm* — International IP Law Group, PLLC

(57) ABSTRACT

The present disclosure provides a memory cell that includes a resistive memory element disposed between a first conductor and a second conductor, the first conductor and the second conductor configured to activate the resistive memory element. The memory cell also includes a diode disposed in parallel with the memory element between the first conductor and the second conductor.

20 Claims, 5 Drawing Sheets

(51) Int. Cl.
*H01L 29/861* (2006.01)
*H01L 29/866* (2006.01)

(52) U.S. Cl.
CPC .... *H01L 27/2463* (2013.01); *H01L 29/66106* (2013.01); *H01L 29/66113* (2013.01); *H01L 29/861* (2013.01); *H01L 29/866* (2013.01); *H01L 45/1233* (2013.01); *H01L 45/1608* (2013.01); *G11C 13/0004* (2013.01); *G11C 13/0007* (2013.01); *G11C 13/0011* (2013.01); *G11C 2013/0045* (2013.01); *G11C 2213/15* (2013.01); *G11C 2213/72* (2013.01); *G11C 2213/75* (2013.01); *G11C 2213/77* (2013.01)

(58) Field of Classification Search
CPC ......... H01L 29/66121; H01L 29/66151; H01L 29/866; H01L 27/2463; G11C 13/003; G11C 13/004; G11C 13/0059
See application file for complete search history.

(56) References Cited

U.S. PATENT DOCUMENTS

| | | | |
|---|---|---|---|
| 2009/0067229 A1* | 3/2009 | Kang | G11C 8/06 365/163 |
| 2010/0008209 A1 | 1/2010 | Tsukamoto et al. | |
| 2011/0228587 A1 | 9/2011 | Ito | |
| 2012/0002458 A1 | 1/2012 | Toda | |
| 2013/0021838 A1 | 1/2013 | Tomotani et al. | |
| 2013/0077389 A1 | 3/2013 | Kitagawa | |

OTHER PUBLICATIONS

Yang, J.J. et al., "Memristive Devices for Computing," (Research Paper), Dec. 27, 2012, available at https://www.ece.ucsb.edu/~strukov/papers/2013/NatNano2013.pdf, 13 pages.

* cited by examiner

100

200

300

400

500

VOLTAGE CONTROL FOR CROSSPOINT MEMORY STRUCTURES

CROSS-REFERENCE TO RELATED APPLICATION

This application is a United States National Stage application of International Patent Application No. PCT/US2013/053041, filed on Jul. 31, 2013, the contents of which are incorporated by reference as if set forth in their entirety herein.

BACKGROUND

A crosspoint memory array is an array of memory cells disposed between two sets of conductors running orthogonally on opposite sides of the memory cells. The first set of conductors, disposed on one side of the memory cells, may be referred to as the word lines, while the second set of conductors, disposed on the other side of the memory cells, may be referred to as bit lines. A multi-layer crosspoint memory array can include several layers of memory cells alternating between layers of word lines and bit lines. Each memory cell in the crosspoint memory array is disposed at the crosspoint of a single word line and a single bit line. Selection of a single memory cell within the array for reading or writing the memory cell can be achieved by activating the word line and bit line associated with that memory cell. Writing data to the memory cell may involve applying a voltage pulse to a selected memory cell to change the memory cell's resistance state. The reading of the selected memory cell may be achieved by applying a read voltage to a selected memory cell and measuring the resulting current through the selected memory cell.

BRIEF DESCRIPTION OF THE DRAWINGS

Certain embodiments are described in the following detailed description and in reference to the drawings, in which.

DETAILED DESCRIPTION

Figure 1:
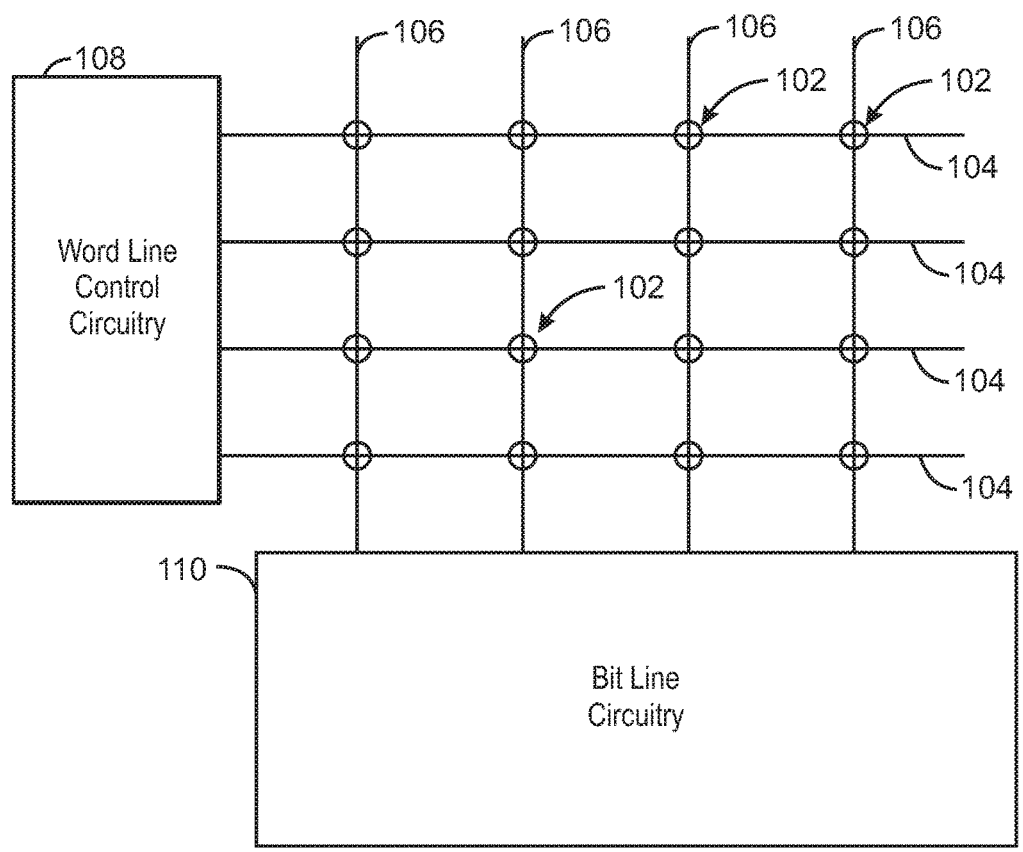
FIG. 1 is a block diagram of an example of a data storage device.

In a crosspoint memory arrays, data may be written to a memory cell by applying a voltage or current pulse to the memory cell that changes the resistance state of the memory cell. For example, a set pulse may be used to obtain a low resistance state representing a logical one, and a reset pulse may be used to obtain a high resistance state representing a logical zero. The crosspoint array may use bipolar or unipolar switching. In bipolar switching, the set voltage and reset voltage have opposite polarity. In unipolar switching, the set voltage and the reset voltage have the same polarity. For example, for some resistive memory elements, the memory cell will switch between states at each voltage pulse.

The voltage seen at an individual cell of a crosspoint memory array during set or reset operations varies widely depending on the location of the cell in the array and the data stored in the array's other cells. This variation is due, in part, to leakage currents that may exist in neighboring cells or cells that share a same interconnect as the selected cell. In multi-layer crosspoint arrays, the large resistance and capacitance of the interconnect structure coupling the write circuitry to the memory cells further contributes to the variation of the set and reset voltages. Thus, pulse voltage variation tends to increase as memory array density increases.

Each time a memory cell receives a set or reset pulse, the memory cell will tend to degrade. The endurance of a memory cell refers to the number cycles that the memory cell can be set and reset before the memory cell fails. In some types of memory cells such as Resistive Random Access Memory (RRAM), the endurance of the memory cell is affected by the degree to which their set and reset pulse voltages are controlled. Poorly controlled set and reset voltages can cause various problems, including reduced cell endurance. For example, set and reset voltages that are too high tend to reduce cell endurance, while carefully selected and reproducible set and reset voltages tend to increase cell endurance. The variation in the set and reset pulse voltages seen at the individual cells significantly degrades their endurance and reduces the product lifetime.

To reduce the variation in the pulse voltages and increase endurance, some crosspoint memory structures are constructed such that each memory cell includes a dedicated transistor that enables access to the cell's memory element. The dedicated transistor provides isolation between the memory cells and, therefore, enables better control of the pulse voltages. However, such a structure is more complicated and expensive to fabricate, and the dedicated transistors reduce the memory density of the crosspoint array.

In accordance with embodiments of the present techniques, each memory cell in the crosspoint array includes a diode disposed in parallel with the memory element between the word line and the bit line. The diode serves to regulate the voltage seen at the memory element during set operations and reset operations. In some embodiments, the crosspoint array is configured to use bipolar switching. If bipolar switching is used, the forward conduction threshold voltage may be designed to match the reset voltage, and the reverse conduction mode threshold voltage may be designed to match the set voltage (or vice versa if a better fit to the desired set/reset voltages is possible). In this way, the diode, which is placed in parallel with the memory element, will shunt current away from the bit cell when exposed to voltages in excess to the designed set or reset voltages. The use of a parallel diode improves control over the set and reset voltages seen by each memory element, resulting in greater endurance and longer product life. The parallel diode also improves the achievable memory density by allowing the construction of larger arrays than would be possible without good control over set and reset voltages.

FIG. 1 is a block diagram of a data storage device. As shown in FIG. 1, the data storage device 100 may include an array of memory cells 102 arranged in rows and columns. A set of conductive electrodes, referred to herein as word lines 104, extend over one side of the array of memory cells 102. Each word line 104 makes electrical contact with the memory cells 102 of a particular row. A set of conductive electrodes, referred to herein as bit lines 106, extend over the other side of the array of memory cells 102. Each bit line 106 makes electrical contact with the memory cells 102 of a particular column. In some examples, the array of memory cells 102 may be a multi-layer array. In a multi-layer array, several arrays of memory cells 102 can be stacked on top of one another with a set of bit lines or a set of word lines disposed between each layer of memory cells. A multi-layer memory cell array can include any suitable number of memory cell layers. In both single-layer and multi-layer arrays, each memory cell 102 lies at the crosspoint of one word line 104 and one bit line 106. Each memory cell 102 may be selected for writing or reading by activating the particular word line 104 and bit line 106 associated with that memory cell 102. As discussed further below in reference to FIG. 2, each memory cell 102 may include a resistive memory element coupled in parallel with a diode.

The data storage device 100 also includes word line control circuitry 108 coupled to the memory cells 102 through the respective word lines 104 and bit line control circuitry 110 coupled to the memory cells 102 through the respective bit lines 106. The word line control circuitry 108 and the bit line control circuitry 110 act in concert to access individual memory cells 102 by activating the corresponding word line 104 and bit line 106 coupled to the selected memory cell 102. It will be appreciated that the word line control circuitry 108 and the bit line control circuitry 110 described herein are examples of circuitry that may be used in an exemplary embodiment for accessing the memory cells 102. Other configurations known to those skilled in the art may be used for accessing the memory cells 102 in accordance with the present techniques.

During a write operation, the word line control circuitry 108 writes information to the selected memory cell 102 by applying a voltage pulse to the specific word line 104 corresponding to the selected memory cell 102. The bit line control circuitry 110 can activate the selected memory cell 102 by coupling the memory cell 102 to ground. The voltage applied to the selected memory cell 102 affects the resistance of the memory cell 102, in effect storing a logical one or logical zero to the memory cell 102. The data storage device 100 may be configured to use bipolar switching or unipolar switching. The change in the resistance can be detected during a subsequent read operation.

As noted above, the writing of a selected memory cell 102 can be affected by leakage currents generated in the memory cells 102 surrounding to the selected memory cell 102 and the resistive and capacitive properties of the interconnects coupling the control circuitry to the memory cells 102. To enable more consistent control of the voltage, each memory cell 102 includes a diode configured to regulate the voltage experienced by the memory cell. In this way, the voltage across the selected memory cell 102 will be more consistent and predictable regardless of the position of the memory cell 102 within the crosspoint array or the resistive values of the surrounding memory cells 102.

Figure 2:
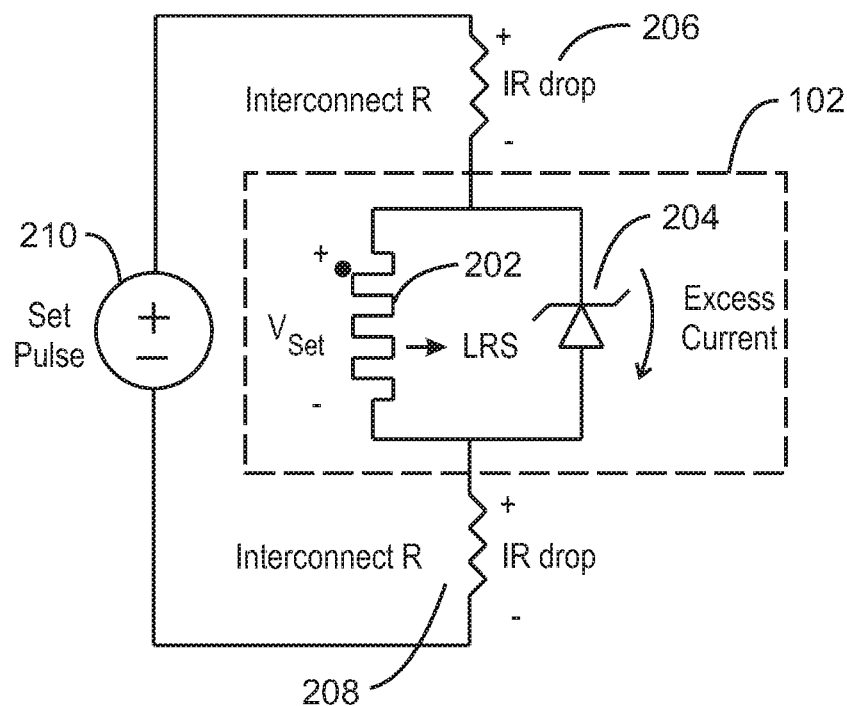
FIG. 2 is a circuit diagram of a memory cell during a set operation.

FIG. 2 is a circuit diagram of a bipolar memory cell during a set operation. As shown in the circuit diagram 200 of FIG. 2, each memory cell 102 may include a memory element 202 and a diode 204 in parallel with the memory element 202. The memory element 202 and the diode 204 are disposed in parallel between the word line 104 and the bit line 106 shown in FIG. 1. The resistance of the conductive paths coupling the memory cell 102 to the control circuitry is represented in the circuit diagram 200 by the interconnect resistors 206 and 208. For example, the interconnect resistors 206 may represent the total resistance of the word lines 104 and all other conductors coupling the memory cell 102 to the word line control circuitry 108. The interconnect resistors 208 may represent the total resistance of the bit lines 106 and all other conductors coupling the memory cell 102 to the bit line control circuitry 110.

The memory element 202 may be a resistive memory element such as a RRAM, Spin-Transfer Torque Random Access Memory (STT-RAM) a conductive bridge resistor, a transition metal oxide based resistor, or any type of resistive changing memory. As used herein, the term resistive memory element refers to a memory element wherein the logical state of the memory element (e.g., whether it stores a one or a zero) is indicated by the resistance of the memory element. In resistive memory elements, the resistance exhibited by the memory element can be changed, for example, by passing current through the resistive memory element or subjecting the resistive memory element to a magnetic field.

The diode 204 can be any diode that enables current to flow in a forward conduction mode and a reverse conduction mode. Examples of such a diode include a zener diode and an avalanche diode. The parameters of the diode 204 can be specified so that the forward conduction modes and reverse conduction modes occur at specified threshold voltages. Furthermore, the polarization of the diode 204 as shown in FIG. 2 can be reversed depending on the design considerations of a particular implementation. The diode 204 can be implemented using any suitable crystalline, polycrystalline, or amorphous semiconductor that can be amenable to standard fabrication processes such as doping. Suitable semiconductor materials may include silicon, gallium arsenide, and germanium, among others. For example, the diode can be implemented by silicon thin-film deposition.

The memory cell 102 may at various times be selected for a write operation such as a set operation or a reset operation. FIG. 2 depicts the memory cell 102 as having been selected for a set operation. In a set operation, a set pulse voltage 210 is generated by control circuitry coupled to the memory cell 102 through the crosspoint array. The set pulse voltage 210 subjects the memory element 202 to a voltage, $V_{set}$, that causes the memory element 202 to enter a low resistance state. The voltage, $V_{set}$, is the actual voltage applied to the ends of the memory element 202 and will be approximately equal to the set pulse voltage 210 minus the voltage drop across the interconnect resistances 206 and 208. To account for variations in the interconnect resistances 206 and 208, the set pulse voltage 210 can be to equal a designed set voltage plus a safety margin that ensures that $V_{set}$ will not be less than the designed set voltage. The designed set voltage is a desired voltage that is intended to be applied to the memory element 202 to achieve a particular resistance level during set operations. The designed set voltage may be chosen based on various design considerations and characteristics of the memory element 202. For example, the designed set voltage may be approximately, 0.5, 0.6, or 0.7 Volts, or any other suitable value.

FIG. 2 shows the polarization of the diode 204 as being oriented so that the diode 202 of the selected memory cell 102 will be reverse biased during a set operation. Given this diode polarity, the diode 204 may be fabricated so that reverse conduction mode threshold voltage of the diode 204 will be approximately equal to the designed set voltage. If the voltage, $V_{set}$, exceeds the designed set voltage, the diode 204 will begin conducting in reverse conduction mode. The added current through the diode 204 increases the overall current through the interconnect resistances 206 and 208. The voltage drop across the interconnect resistances 206 and 208 will increase in proportion to the current shunted through the diode 204, and the actual set voltage, $V_{set}$, will tend to settle near the reverse conduction mode threshold voltage of the diode 204. In this way, the diode 204 helps to ensure that the actual set voltage is consistent for each set operation despite variations in interconnect resistances 206 and 208 that may arise between set operations.

Figure 3:
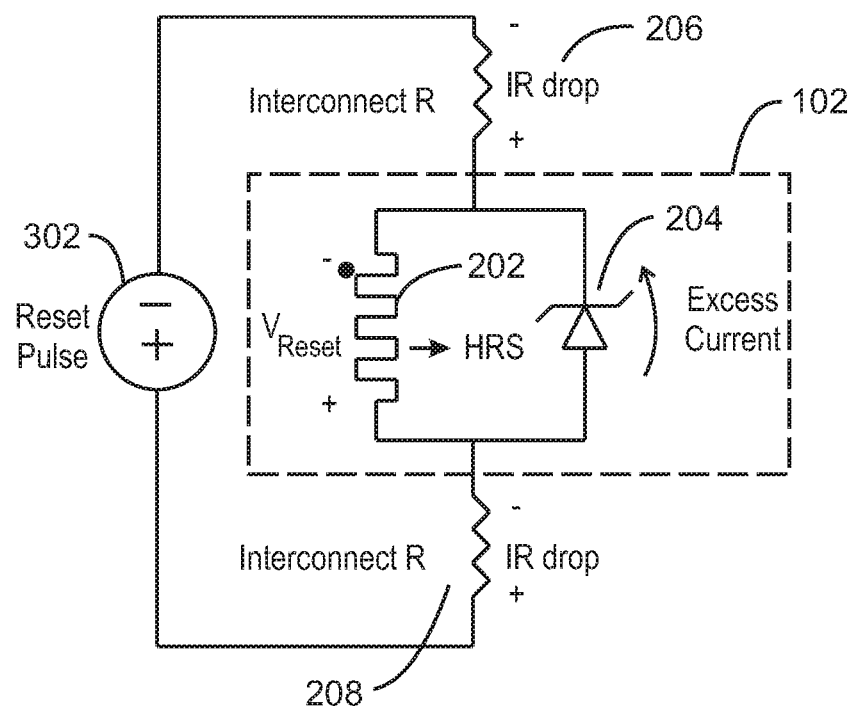
FIG. 3 is a circuit diagram of a memory cell during a reset operation.

FIG. 3 is a circuit diagram of a bipolar memory cell during a reset operation. The memory cell 102 is the same as the memory cell 102 shown in FIG. 2, and includes a memory element 202 and a diode 204 in parallel with the memory element 202, as described above in relation to FIG. 2. FIG. 3 depicts the memory cell 102 as having been selected for a reset operation. In a reset operation, a reset pulse voltage 302 is generated by control circuitry coupled to the memory cell 102 through the crosspoint array. The reset pulse voltage 302 subjects the memory element 202 to a voltage, $V_{reset}$, that has the opposite polarity of the set voltage, $V_{set}$, and causes the memory element 202 to enter a high resistance state. The voltage, $V_{reset}$, is the actual voltage applied to the ends of the memory element 202 and will be approximately equal to the reset pulse voltage 302 minus the voltage drop across the interconnect resistances 206 and 208. To account for variations in the interconnect resistances 206 and 208, the reset pulse voltage 302 can be equal to a designed reset voltage plus a safety margin that ensures that $V_{reset}$ will not be less than the designed reset voltage. The designed reset voltage is a desired voltage that is intended to be applied to the memory element 202 to achieve a particular resistance state during reset operations. The designed set voltage may be chosen based on various design considerations and characteristics of the memory element 202. For example, the designed reset voltage may be approximately 0.5, 0.6, or 0.7 Volts, or any other suitable value.

The diode 202 of FIG. 3 is oriented such that the diode 204 of the selected memory cell 102 will be forward biased during a reset operation. Given this diode polarity, the diode 204 may be fabricated so that the forward conduction mode threshold voltage of the diode 204 will be approximately equal to the designed reset voltage. If the voltage, $V_{reset}$, exceeds the designed reset voltage, the diode 204 will begin conducting in forward conduction mode. The added current through the diode 204 increases the overall current through the interconnect resistances 206 and 208. The voltage drop across the interconnect resistances 206 and 208 will increase in proportion to the current shunted through the diode 204, and the actual reset voltage, $V_{reset}$, will tend to settle near the forward conduction mode threshold voltage of the diode 204. In this way, the diode 204 helps to ensure that the actual reset voltage is consistent for each reset operation despite variations in interconnect resistances 206 and 208 that may arise between reset operations.

Figure 4:
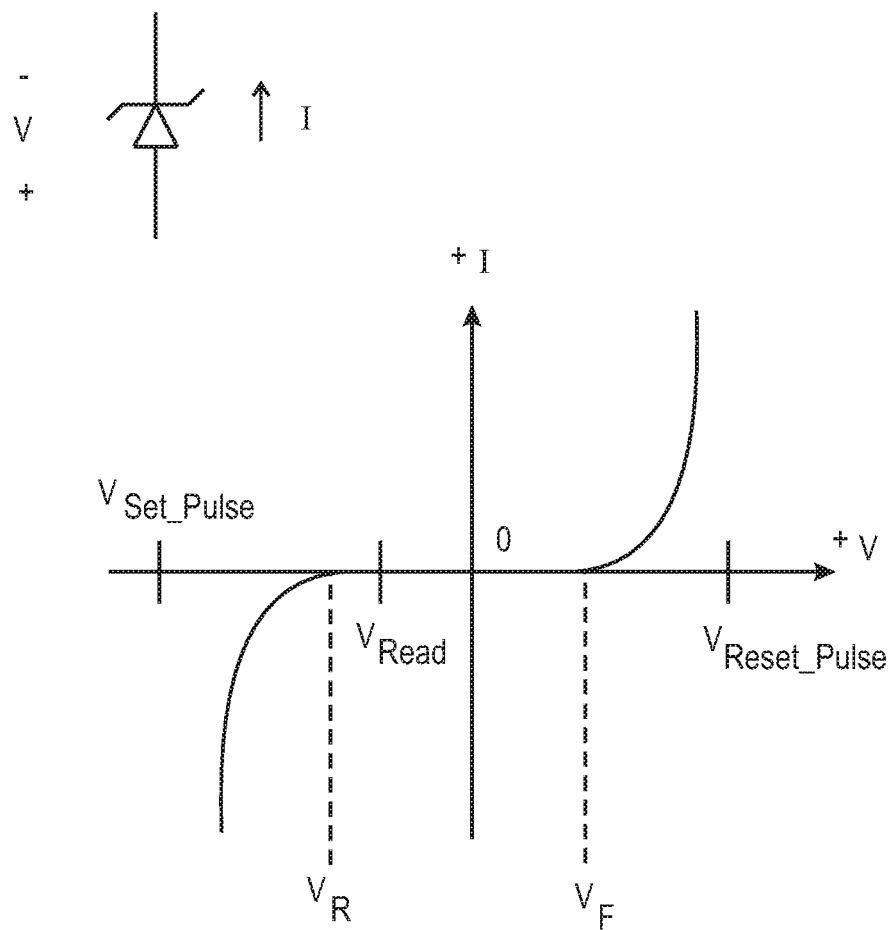
FIG. 4 is a current-voltage diagram of an example diode that may be used in the memory cell.

FIG. 4 is a current-voltage diagram of an example diode that may be used in the memory cell. The current-voltage diagram 400 shows the I-V characteristics of an example diode under forward biased and reverse biased conditions. The example diode characteristics may correspond to the diode 204 shown in FIGS. 2 and 3. The example diode of FIG. 4 exhibits a forward conduction mode threshold voltage, $V_F$, which is often referred to simply as the threshold voltage, $V_{th}$, of the diode. The example diode of FIG. 4 also exhibits a reverse conduction mode threshold voltage, $V_R$, which may be referred to as the reverse-breakdown voltage. For example, the forward conduction mode threshold voltage may be may be approximately 0.2 to 0.7 Volts, and the reverse conduction mode threshold voltage may be may be approximately −0.2 to −0.7 Volts. Between the voltage thresholds $V_F$ and $V_R$, the current through the diode remains negligible. The diode conducts current in the forward biased direction when the applied voltage exceeds the forward conduction mode threshold voltage, $V_F$. Similarly, the diode conducts current in the reverse biased direction when the magnitude of the voltage exceeds the magnitude of the reverse conduction mode threshold voltage, $V_R$.

As shown in FIG. 4, the voltage of the reset pulse, $V_{RESET\_PULSE}$, can be set to a value greater than the forward conduction mode threshold voltage. Additionally, the diode can be fabricated so that the forward conduction mode threshold voltage is approximately equal to the designed reset voltage. In this way, the actual voltage at the memory element during reset operations will be approximately equal to the forward conduction mode threshold voltage. The voltage of the set pulse, $V_{SET\_PULSE}$, can be set to a value less (i.e., greater in magnitude) than the reverse conduction mode threshold voltage. Additionally, the diode can be fabricated so that the reverse conduction mode threshold voltage is approximately equal to the designed set voltage. In this way, the actual voltage at the memory element during set operations will be approximately equal to the reverse conduction mode threshold voltage. The voltage used to read the memory element, $V_{READ}$, can be any value between the reverse conduction mode threshold voltage and the forward conduction mode threshold voltage that doesn't switch the cell. The diode's lack of conduction at lower voltages enables it to appear as a high impedance during memory cell read operations so that it will have little to no effect during read operations.

FIGS. 2-4 describe a memory cell configured for bipolar switching. However, in some examples, each memory cell uses unipolar switching. If the memory cells use unipolar switching, then only one polarity of the parallel diode matters for controlling the voltage applied to the memory elements. In unipolar switching, the parallel diode 204 can be fabricated so that either the forward conduction threshold voltage or the reverse conduction threshold voltage is used limit the voltage applied to the memory element, depending on which threshold voltage is easier to fabricate for the desired voltage setting. For example, the diode 204 may be fabricated so that the forward conduction threshold voltage is set to the higher of the designed set voltage or the designed reset voltage.

Figure 5:
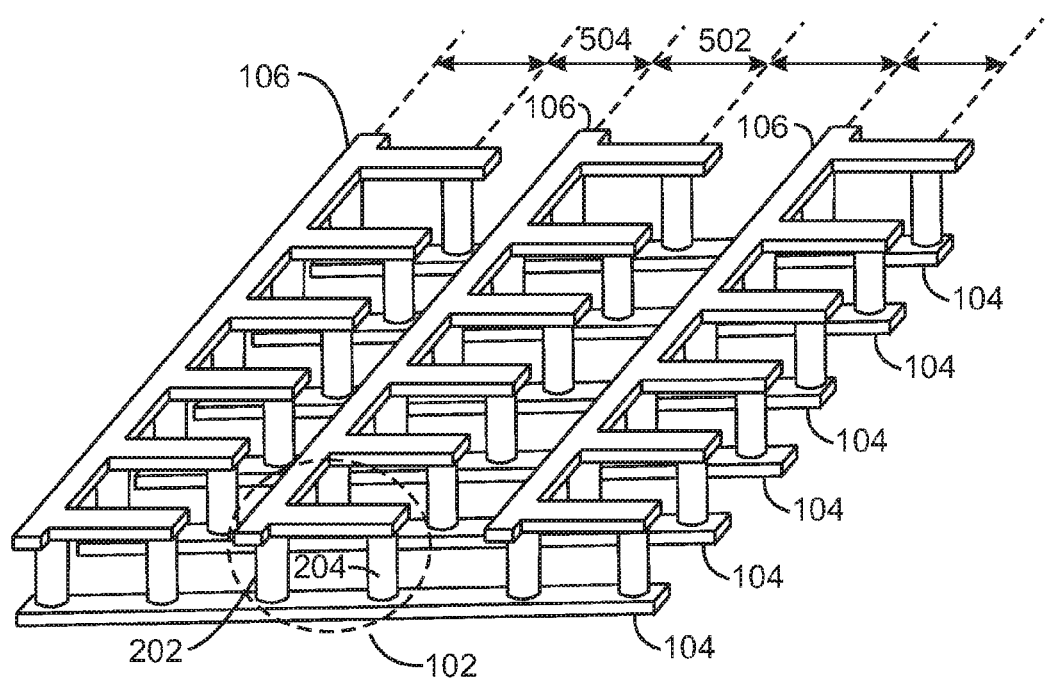
FIG. 5 is a perspective view of a portion of a crosspoint array showing memory cells that include a memory element and a parallel diode.

FIG. 5 is a perspective view of a portion of a crosspoint array showing memory cells that include a memory element and a parallel diode. For the sake of clarity, only a single layer of memory cells 102 is shown. However, in some examples, the crosspoint array may be a multi-layer crosspoint array. The crosspoint array of FIG. 5 is not necessarily drawn to scale. Furthermore, it will be appreciated that an actual crosspoint array may include many more memory cells that what is shown in FIG. 5.

As shown in FIG. 5, the crosspoint array includes a matrix of memory cells 102 electrically coupled to word lines 104 and bit lines 106. According to the perspective of FIG. 5, the bit lines 106 are shown as being disposed above the memory cells 102. In a multi-layer crosspoint array, additional memory cells (not shown) may be disposed above the bit lines 106 and an additional set of word lines (not shown) may be disposed above the additional memory cells. Alternating layers of memory cells, word lines and bit lines may be stacked to create a crosspoint array of any suitable size depending on the desired number of layers.

Each of the memory cells 102 includes a memory element 202 disposed in parallel with a diode 204 between the bit line and the word line. In the example shown in FIG. 5, columns of memory elements 202 are alternated with columns of diodes 204 and the word line 106 is stubbed from each memory element 202 to its associated diode. In some embodiments, the distance 502 between the memory element 202 and its corresponding diode 204 is approximately equal to the distance 504 between the memory element 202 and the diode 204 of the adjacent memory cell 102. In such embodiments, the crosspoint array 500 resembles an array wherein every other column of memory elements has been replaced by a column of diodes 204. However, other arrangements are also possible. In some embodiments, the distance 502 is smaller than the distance 504. In some embodiments, the diode 204 and the memory element 202 may be touching or coupled together. For example, the diode 204 and the memory element 202 may be integrated into one body. The diode 204 and the memory element 202 may be electrically isolated using an insulative layer disposed between the diode 204 and the memory element 202.

The examples described herein may be susceptible to various modifications and alternative forms and have been shown only for illustrative purposes. Furthermore, it is to be understood that the present techniques are not intended to be limited to the particular examples disclosed herein. Indeed, the scope of the appended claims is deemed to include all alternatives, modifications, and equivalents that are apparent to persons skilled in the art to which the disclosed subject matter pertains.

What is claimed is:

1. A memory cell, comprising:
    a resistive memory element disposed between a first conductor and a second conductor, the first conductor and the second conductor configured to activate the resistive memory element; and
    a diode disposed in parallel with the memory element between the first conductor or the second conductor, a conduction threshold voltage of the diode being approximately equal to a designed set voltage or a designed reset voltage of the resistive memory element.

2. The memory cell of claim 1, wherein the resistive memory element comprises at least one of a memristor, a Phase Change Material resistor, a conductive bridge resistor, and a transition metal oxide based resistor.

3. The memory cell of claim 1, wherein:
    the conduction threshold voltage of the diode is a first conduction threshold voltage; and
    the first conduction threshold voltage of the diode is approximately equal to the designed set voltage of the memory element and a second conduction threshold voltage of the diode is approximately equal to the designed reset voltage of the memory element.

4. The memory cell of claim 3, wherein the first conduction threshold voltage of the diode is the forward conduction mode threshold voltage and a second conduction threshold voltage of the diode is the reverse conduction mode threshold voltage.

5. The memory cell of claim 1, wherein the diode is a Zener diode or an avalanche diode.

6. The memory cell of claim 1, wherein the resistive memory element has a designed set pulse voltage greater than the conduction threshold voltage of the diode.

7. The memory cell of claim 1, wherein the resistive memory element has a designed reset pulse voltage less than the conduction threshold voltage of the diode.

8. A data storage device, comprising
    a memory cell array comprising a plurality memory cells;
    word lines electrically coupled to the plurality of memory cells; and
    bit lines electrically coupled to the plurality of memory cells, wherein each memory cell in the plurality of memory cells lies at a crosspoint of one of the word lines and one of the bit lines;
    wherein each of the plurality of memory cells comprises:
        a resistive memory element disposed between one of the word lines and one of the bit lines; and
        a diode disposed in parallel with the memory element between the word line and the bit line, a conduction threshold voltage of the diode being approximately equal to a designed set voltage or a designed reset voltage of the resistive memory element.

9. The data storage device of claim 8, wherein the resistive memory element comprises at least one of a Resistive Random Access Memory (RRAM) element, a Spin-Transfer Torque Random Access Memory (STT-RAM) element, a conductive bridge resistor, and a transition metal oxide based resistor.

10. The data storage device of claim 8, wherein:
    the conduction threshold voltage of the diode is a first conduction threshold voltage is a first conduction threshold voltage; and
    the first conduction threshold voltage of the diode is approximately equal to the designed set voltage of the memory element and a second conduction threshold voltage of the diode is approximately equal to the designed reset voltage of the memory element.

11. The data storage device of claim 10, wherein the first conduction threshold voltage of the diode is the forward conduction mode threshold voltage and a second conduction threshold voltage of the diode is the reverse conduction mode threshold voltage.

12. The data storage device of claim 8, wherein the memory cell array is a multi-layer array comprising alternating layers of memory cells, bit lines, and word lines.

13. The data storage device of claim 8, wherein a selected memory cell is configured to be read by applying a voltage across the word line and the bit line corresponding to the selected memory cell, a magnitude of the voltage being less than a magnitude of a threshold voltage of the diode.

14. The data storage device of claim 8, wherein the resistive memory element has a designed set pulse voltage equal to the conduction threshold voltage of the diode plus a safety margin voltage.

15. A method of forming a memory cell, comprising:
    disposing a resistive memory element between two electrodes;
    disposing a diode in parallel with the resistive memory element between the two electrodes, the diode having a conduction threshold voltage approximately equal to a designed set voltage or a designed reset voltage of the resistive memory element.

16. The method of claim 15, wherein disposing the resistive memory element comprises forming a memristor.

17. The method of claim 15, wherein disposing the diode comprises forming a zener diode or an avalanche diode.

18. The method of claim 15, wherein:
    the conduction threshold voltage of the diode is a first conduction threshold voltage; and
    disposing the diode comprises forming the diode with the first conduction threshold voltage approximately equal to the designed set voltage of the memory element and a second conduction threshold voltage approximately equal to the designed reset voltage of the memory element.

19. The method of claim 15, wherein the conduction threshold voltage of the diode is approximately equal to the greater magnitude of the designed set voltage and the designed reset voltage.

20. The method of claim 15, wherein disposing a resistive memory element between two electrodes comprises:

disposing a resistive memory element having a designed set pulse voltage greater than the conduction threshold voltage of the diode or a designed reset pulse voltage less than the conduction threshold voltage of the diode.

* * * * *